United States Patent [19]
Siew et al.

[11] Patent Number: 5,835,327
[45] Date of Patent: Nov. 10, 1998

[54] ESD PROTECTION CONTINUOUS MONITORING DEVICE

[75] Inventors: Adriel Siew, Lincoln, Nebr.; Lee Seah Doo, Singapore, Singapore

[73] Assignee: Advanced Micro Devices, Inc., Sunnyvale, Calif.

[21] Appl. No.: 756,002

[22] Filed: Nov. 25, 1996

[51] Int. Cl.[6] .................................................. H02H 3/22
[52] U.S. Cl. .............................. 361/111; 361/56; 361/58
[58] Field of Search .................. 361/56, 91, 58, 361/111, 115, 118, 119, 127

[56] References Cited

U.S. PATENT DOCUMENTS 3,852,733   12/1974   Sakurai ................................... 340/251
5,010,438   4/1991    Brady ....................................... 361/56

Primary Examiner—Jeffrey A. Gaffin
Assistant Examiner—Stephen Jackson
Attorney, Agent, or Firm—Fliesler, Dubb, Meyer & Lovejoy

[57] ABSTRACT

An electro-static discharge (ESD) protection continuous monitoring device includes two or more resistance comparison circuits which compare the grounding resistances to earth ground of two or more electrical nodes to a maximum acceptable ESD protection resistance mandated by the ESD protection specification. An ESD protection failure indicator is driven by a logic circuit coupled to the resistance comparison circuits and activates when one or more of the resistance comparison circuits detects that the grounding resistance is greater than the maximum acceptable ESD protection resistance. The ESD protection continuous monitoring device includes a reference resistor which represents the maximum acceptable ESD protection resistance for any given monitored node. A reference resistor failure indicator notifies the operator that the reference resistor is faulty. In another embodiment, a semiconductor handling system includes a fully operational semiconductor handler which is equipped with an ESD protection continuous monitoring device that uses the same power supplies as the semiconductor handler itself.

23 Claims, 4 Drawing Sheets

ESD PROTECTION CONTINUOUS MONITORING DEVICE

BACKGROUND OF THE INVENTION

1. Field of the Invention

The present invention relates to the field of electro-static discharge protection in semiconductor handling machines. Specifically, the present invention relates to devices which test for acceptable electrostatic discharge protection and to semiconductor handling systems insuring acceptable electrostatic discharge protection for devices being tested, marked, and packed for shipment.

2. Discussion of the Related Art

The dielectric breakdown strength of $SiO_2$ is approximately $8 \times 10^6$ Volts per centimeter. Therefore, a 200 Angstrom gate oxide in a MOS transistor will not sustain a gate voltage in excess of about 16 Volts. When dielectric breakdown of a gate oxide occurs, the oxide ruptures resulting in a hole in the oxide layer where the breakdown current had flown. Although voltages above 16 Volts are in excess of the normal operating voltages of most standard VLSI circuits, voltages higher than the gate breakdown voltage may be placed on the circuits due to static charge build up on the semiconductor handler during processing after fabrication of the wafers.

A major source of excessive voltage is triboelectricity, which results when two materials are rubbed together. A person walking across a room or simply removing an integrated circuit from its plastic packaging material can generate static charges in excess of 15,000 Volts potential. A human body, initially charged to a potential of 2000 Volts, will cause a peak current flow of several amperes and a peak power dissipation of several kilowatts when the body is discharged into an integrated circuit. If this high-voltage charge is discharged into an integrated circuit, it may damage the circuit enough to cause immediate catastrophic failure of the circuit which can be detected during final testing. However, if the catastrophic damage occurs during packing for shipment after final testing has been performed, the non-working unit is shipped to the final customer. A more troublesome problem occurs when an electro-static discharge causes latent damage to the circuit. In this case, the device is damaged only slightly so that no immediate damage is detected during final testing, but the device fails early in its operating life once it has passed inspection in the manufacturing facility and is installed in a product in the field.

In processing semiconductors products during manufacturing, packaging, testing, marking, and packing, electromechanical semiconductor handling machines are used to physically and electrically manipulate the products as they are processed. In order to physically manipulate the circuits, these machines have moving parts which can generate static charges. Static charges can also build up as the circuits are contacted and released by the semiconductor handling machines. Both catastrophic and latent damage to the products caused during device handling by electro-static discharge add expense and are highly undesirable.

In order to prevent damage to the devices being processed by the semiconductor handling machines, it is necessary to provide a path for discharge of any static charges on the handling machines before these charges reach dangerously high voltages. Therefore, a low resistance grounding path must exist from every critical electrical node on a handling machine to the earth ground so that static charges will discharge through the grounding path rather than through the devices being processed. Typically, the resistances from various critical electrical nodes to earth ground are measured and grounding wires are installed on critical nodes if the measured resistance to earth ground is unacceptably high.

Most manufacturing facilities institute a grounding specification based upon the types of devices being processed which mandates a maximum grounding resistance for critical electrical nodes on its semiconductor handling machines. For most device types manufactured with modern technologies, grounding resistances lower than 10 ohms are acceptable. In other words, 10 ohms represents an ESD protection maximum grounding resistance for critical electrical nodes on the semiconductor handling machines.

One conventional way of enforcing the grounding specification is to manually check the grounding resistances of the handling equipment periodically when the equipment is taken off-line. For example, every three months, the handling equipment is inspected for conformance with the ESD protection specification. Paper records are kept as to the results of the inspections. If a non-conformance is detected during the inspection, that is, if a critical node is measured to have a resistance to earth ground greater than 10 ohms, for example, a grounding wire is installed at the node to cure the non-conformance.

However, there are several problems with the above-described conventional procedure for ESD protection grounding inspection and repair. For example, during the periods between ESD protection grounding inspections, excessively high grounding resistances may develop due to corrosion, grounding wire breakage, or other means. In this case, the non-conformance to the ESD protection specification is not detected until the next subsequent ESD protection grounding inspection. In the interim, ESD events at the non-conforming electrical node on the device handler may cause detected or undetected catastrophic or latent damages to many devices. The undetected damages to devices increase the time and costs incurred in failure analysis of the affected devices, as well as decreasing the functional yield of the manufacturing process as a whole.

Furthermore, the manual ESD protection inspection itself is a very costly procedure as it necessitates an inspector's time to perform the inspection, it necessitates taking the semiconductor handler off-line to measure resistances from critical electrical nodes, and it involves cumbersome record keeping.

As is apparent from the foregoing discussion, a need exists for a more efficient and effective means to insure conformance to an ESD protection specification.

SUMMARY OF THE INVENTION

In the processing and testing of semiconductor devices, conventional electro-static discharge (ESD) protection inspection procedures involve manually measuring the resistance to earth ground of critical electrical nodes and moving parts of semiconductor handlers. These conventional procedures are undesirably costly, inconvenient, and ineffective. An object of the present invention is to provide continuous monitoring of critical device paths on semiconductor device handlers during normal operation of those handlers. Another object of the present invention is to provide immediate notification to an operator of improper or damaged grounding of a semiconductor handler. Yet another object of the present invention is eliminating the need for manual ESD protection inspection of the semiconductor handlers. Other objects of the present invention are increasing the usable yield of devices in the processing and testing and decreasing the time and cost incurred in failure analysis of devices spent on devices damaged by ESD events.

According to one aspect of an embodiment of the present invention, an ESD protection continuous monitoring device includes two or more resistance comparison circuits which compare the grounding resistances to earth ground of two or more electrical nodes to a maximum acceptable ESD protection resistance mandated by the ESD protection specification. An ESD protection failure indicator is driven by a logic circuit coupled to the resistance comparison circuits and activates when one or more of the resistance comparison circuits detects that the grounding resistance is greater than the maximum acceptable ESD protection resistance. In the preferred embodiment, the ESD protection failure indicator is an audible buzzer and a light-emitting diode.

According to another aspect of the embodiment of the present invention, each resistance comparison circuit within the ESD protection continuous monitoring device includes a voltage comparator and a monitored node ESD protection failure indicator which activates when the electrical node monitored by that circuit violates the ESD protection specification. In the preferred embodiment, the monitored node ESD protection failure indicators are implemented with light-emitting diodes. These individual monitored node indicators give the operator of the semiconductor handler the specific information of which monitored node or nodes has violated the ESD protection specification.

According to yet another aspect of an embodiment of the present invention, the ESD protection continuous monitoring device includes a reference resistor which represents the maximum acceptable ESD protection resistance for any given monitored node. A reference resistor failure indicator notifies the operator that the reference resistor is faulty; therefore, indicates to the operator that the ESD protection continuous monitoring device needs repair or replacement.

According to another embodiment of the present invention, a semiconductor handling system includes a fully operational semiconductor handler which is equipped with an ESD protection continuous monitoring device that uses the same power supplies as the semiconductor handler itself. The inputs of the ESD protection continuous monitoring device are coupled to critical nodes of the semiconductor handler, the handler's moving parts, and the parts which directly contact the devices being processed. Any unused inputs to the ESD protection continuous monitoring device are connected to the ground power supply.

These and other embodiments, aspects, and features of the present invention are fully described in the Detailed Description of the Invention in conjunction with the Drawings, in which like parts are represented with like numerals.

BRIEF DESCRIPTION OF THE DRAWINGS

In all the Figures, like parts are designated by like numerals. The Figures are more thoroughly explained in the Detailed Description of the Invention.

DETAILED DESCRIPTION OF THE INVENTION

Figure 1:
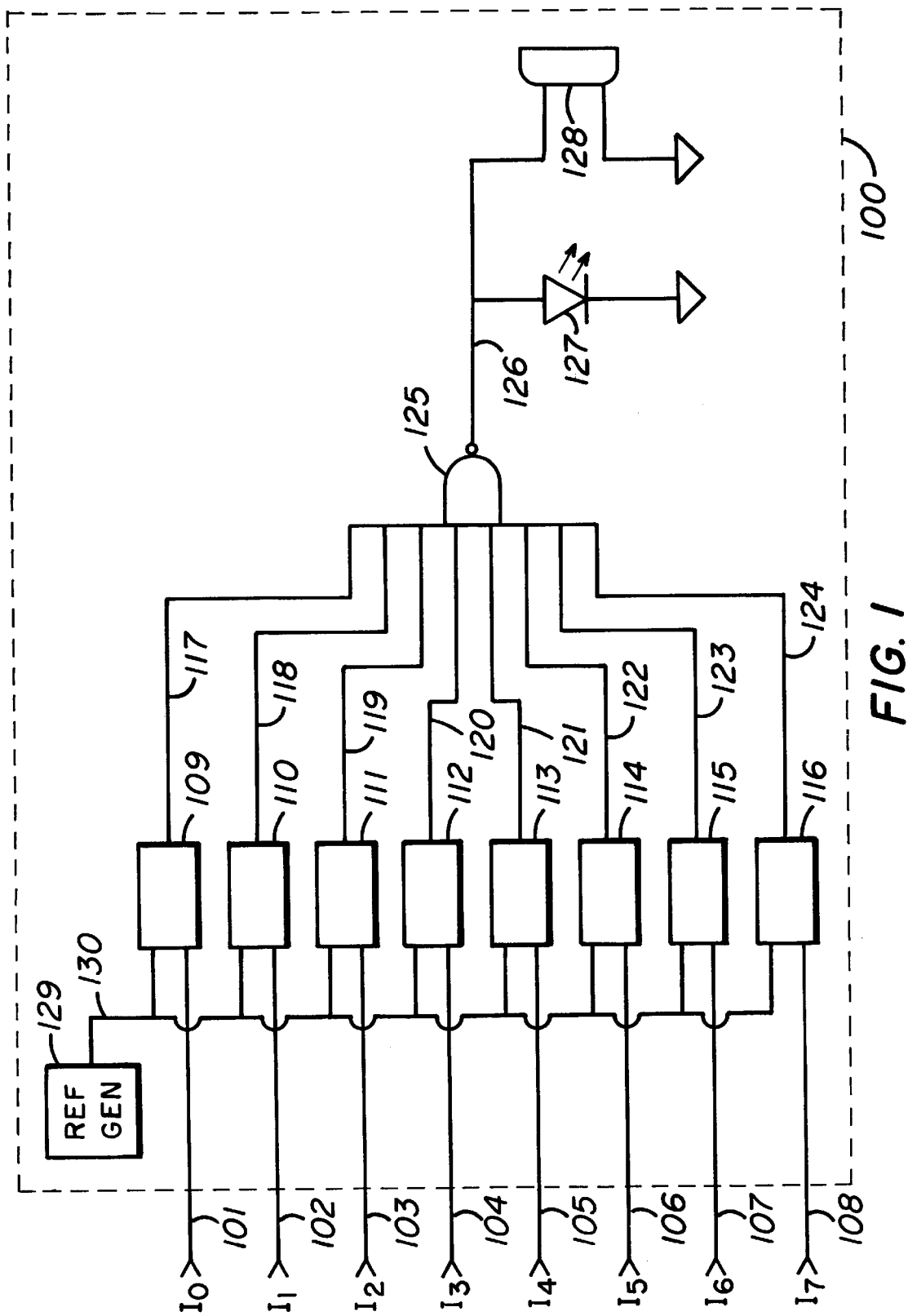
FIG. 1 illustrates an embodiment of an ESD continuous monitoring device according to the present invention.

FIG. 1 logically illustrates an embodiment of an ESD protection continuous monitoring device according to the present invention. The ESD protection continuous monitoring device 100 continuously monitors up to eight nodes for adequate ESD protection. A node is deemed to have adequate electro-static discharge (ESD) protection if the resistance to the earth ground voltage potential is less than a predetermined specified maximum acceptable grounding resistance. In the presently preferred embodiment, the maximum acceptable grounding resistance is 8.2 ohms. In this presently preferred embodiment, there is no ESD protection violation as long as all monitored nodes have a resistance to the earth ground potention which is less than 8.2 ohms. The requirement of a low resistance to earth ground prevents build up of high voltage charges at the monitored nodes; therefore eliminating the possibility of unwanted static discharges which can damage devices.

The presently preferred 8.2-ohm maximum acceptable grounding resistance is offered by way of example, not by way of limitation, therefore the present invention also monitoring against maximum acceptable grounding resistances greater than or less than 8.2 ohms. For example, 10 ohms is often specified as a standard maximum grounding resistance. As advances in technology yield smaller feature sizes and thinner oxide thicknesses, maximum acceptable grounding resistances less 8.2 ohms will undoubtedly become necessary to insure prevention of damage to devices due to electro-static discharges.

The ESD protection continuous monitoring device 100 illustrated in FIG. 1 includes eight inputs 101–108 for monitoring eight electrical nodes of a production device handler. FIG. 1 illustrates eight inputs 101–108 by way of example; thus, it is to be understood that the present invention covers any number of inputs greater than or equal to two inputs. For example, the presently preferred embodiment includes sixteen separate inputs. The eight-input device 100 illustrated in FIG. 1 includes eight resistance comparison circuits 109–116 corresponding to the eight inputs 101–108. Each resistance comparison circuit 109–116 determines whether or not the resistance seen from the corresponding input 101–108 (the measured resistance) is less than a predetermined specified maximum acceptable protection resistance.

Each resistance comparison circuit 109–116 produces a corresponding logic output 117–124 which assumes one state when the measured resistance is less than the maximum acceptable protection resistance, and assumes the logically opposite state when the measured resistance is greater than the maximum acceptable protection resistance. In the embodiment illustrated in FIG. 1, the resistance comparison circuits 109–116 produce logically "true" outputs (outputs driven to the positive supply voltage) when no ESD protection failure is detected; thus the outputs 117–124 are all "true" when the measured resistances are all less than the maximum acceptable protection resistance. In the embodiment illustrated in FIG. 1, the resistance comparison circuits 109–116 produce logically "false" outputs (outputs driven to the ground supply voltage) when an ESD protection failure is detected because one or more of the measured resistances is greater than the maximum acceptable protection resistance.

A logic circuit 125 combines the logic outputs 117–124 from the resistance comparison circuits 109–116 into a single logic signal 126 indicating whether or not one or more of the resistance comparison circuits 109–116 have detected an ESD protection failure. In the embodiment illustrated in FIG. 1, the logic circuit 125 is an eight-input NAND gate.

The logic circuit 125 drives an ESD protection failure indicator which activates when one or more of the resistance comparison circuits 109–116 detects an ESD protection failure. In the embodiment illustrated in FIG. 1, two ESD protection failure indicators are included; the first is a light-emitting diode (LED) 127, while the second is an audible buzzer 128.

The presently preferred embodiment uses a NAND gate to implement the logic circuit 125; however, there is no requirement that a NAND gate be used. For example, the logic circuit 125 can be implemented as an AND gate, in which case the cathode of the LED 127 is connected to the positive power supply, its anode is connected to the AND output, and one terminal of the buzzer 128 is connected to the positive power supply.

Moreover, if the logical polarity of the outputs 117–124 of the resistance comparison circuits 109–116 is reversed ("true" indicates ESD protection failure), then the logic gate 125 must be of the OR or NOR type. In any case, there is no requirement that the logic circuit 125 be implemented in a single gate or even in a single level of logic. In fact, in the presently preferred embodiment, a sixteen input NAND function is realized with three levels of logic using two 13-input NAND gates and an inverter-connected two-input NAND gate.

The ESD protection continuous monitoring device 100 further includes a reference voltage generator 129 which produces a reference voltage 130 that is routed to each of the resistance comparison circuits 109–116 and that facilitates comparison of the resistances from the monitored nodes to the earth ground to the predetermined specified maximum acceptable grounding resistance.

Figure 2:
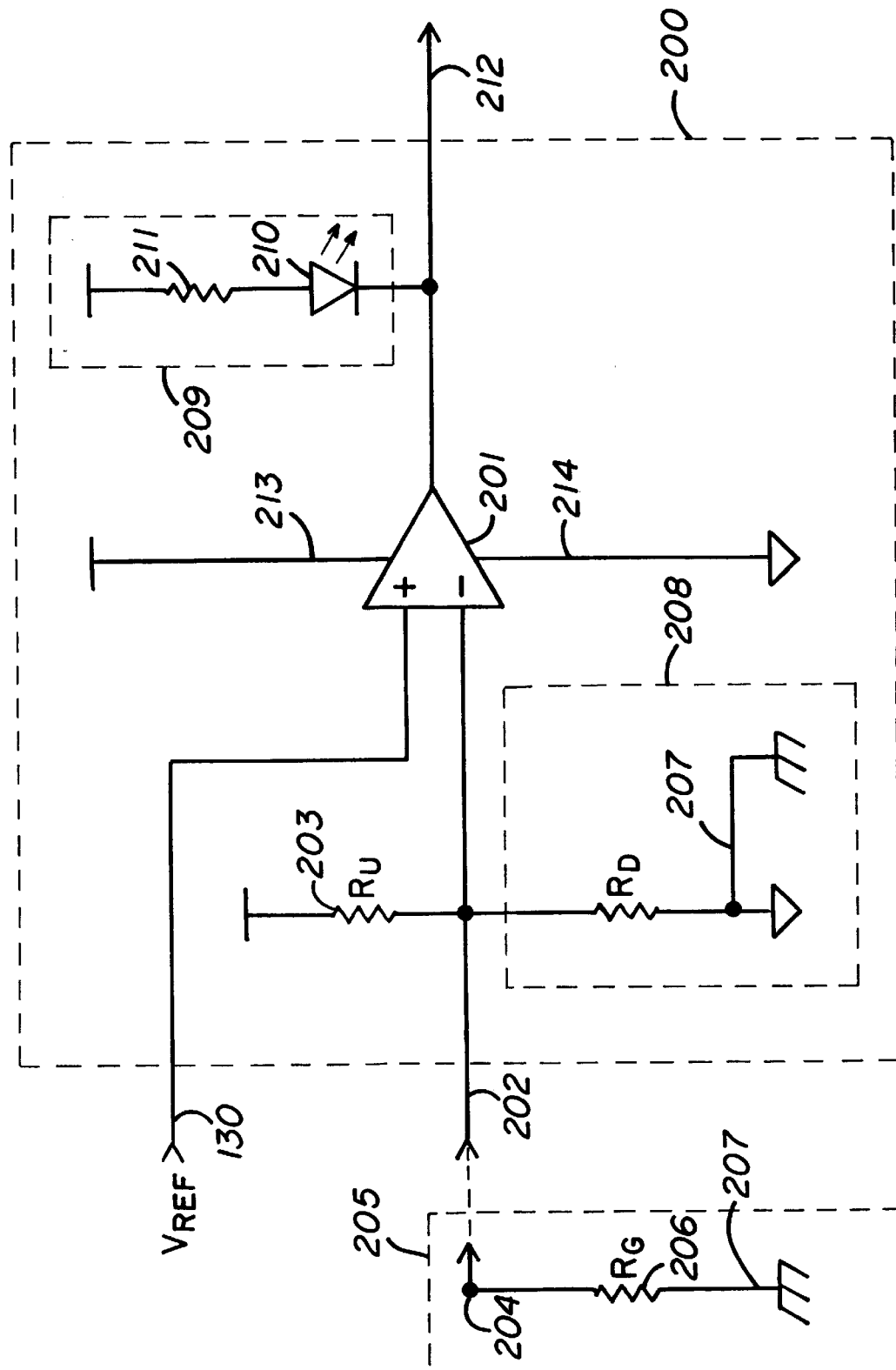
FIG. 2 illustrates a resistance comparison circuit suitable for use in an ESD continuous monitoring device according to the present invention.

FIG. 2 illustrates a resistance comparison circuit 200 suitable for implementing the ESD protection continuous monitoring device 100 according to the present invention. The resistance comparison circuit 200 uses a voltage comparator 201 as its central component. The voltage comparator 201 is typically an operational amplifier. The plus input of the voltage comparator 201 is coupled to the reference voltage 130, while the minus input 202 of the voltage comparator 201 is coupled to one of the inputs 101–108 of the ESD protection continuous monitoring device 100. When in operation, the input 202 is coupled to a monitored node 204 on the semiconductor handler 205. The resistance 206 illustrates the equivalent grounding resistance seen from the input terminal 202 through the monitored node 204 and the semiconductor handling equipment 205 to the earth ground. In other words, the resistance 206 does not represent a physical resistor, but rather represents the equivalent resistance seen from the input terminal 202. In a properly grounded semiconductor handler 206, the resistance 206 will be very low, and ground wires may be attached to various parts of the semiconductor handler 206 in order to assure that the equivalent resistance 206 is very low.

Using the voltage divider relationship, the resistance comparison circuit 200 compares the resistance 206 from a monitored node to the earth ground with the maximum acceptable grounding resistance. A relatively large pullup resistor 203 (upper voltage divider resistor 203) couples the positive power supply to the input 202. When the input 202 is connected to an electrical node for ESD protection monitoring, a small current flows from the positive power supply through the resistor 203 to the input 202, then through the monitored node 204 and into the earth ground 207.

The pulldown resistor 208 (lower voltage divider resistor 208) is not critical to the resistance comparison circuit 200 according to the present invention. In the absence of the pulldown resistor 208, the voltage at the comparator's minus input 202 is $Vcc*R_G/(R_U+R_G)$ In the preferred embodiment of the present invention, the resistance comparison circuits 200 each include a relatively large pulldown resistor 208 which couples the comparator's minus input 202 to the earth ground 207. In this preferred embodiment, the voltage at the comparator's minus input 202 is $Vcc*R_G R_D/(R_U R_G + R_U R_D + R_G R_D)$. In either case, if $R_G << R_U$ and $R_G << R_D$, then the voltage at the comparator's minus input 202 is approximately $Vcc*R_G/R_U$. When the semiconductor handler 205 is properly grounded, the equivalent resistance $R_G$ is very low in comparison to pullup resistance $R_U$, thus the voltage at the monitored node 204 and at the minus input 202 of the comparator 201 is very low, nearly equal to the earth ground potential. This low voltage at the monitored node 204 insures that no high voltage charge can build up at the monitored node 204 which could potentially cause an undesirable electo-static discharge. Because it is desirable that the current through the monitored node is very small, $R_U$ is chosen to be a large resistor. Because it is desirable that the voltage at the monitored node 204 be very small relative to the earth ground, $R_U$ is chosen to be much larger than $R_G$.

In the presently preferred embodiment, the resistance comparison circuit 201 further includes a monitored node ESD protection failure indicator 209 which activates when the grounding resistance $R_G$ of the monitored node 204 is too high. As illustrated in FIG. 2, the indicator is preferably a light-emitting diode 210 (LED 210) in series with a current limiting resistor 211. The resistance of the current limiting resistor 211 should be high enough to prevent the LED 210 from burning out and low enough to allow sufficient illumination. The series order of the resistor 211 and the LED 210 can be interchanged; in other words, the LED's cathode can be directly coupled to the positive power supply while the resistor 211 is coupled to the comparator output 212. In the preferred embodiment, the positive power supply 213 for the comparator 201 is the same Vcc voltage coupled to the pullup resistance 203, while the negative power supply 214 is the earth ground voltage 207 to which the pulldown resistor 208 is coupled. Whenever the voltage at the input 202 is lower than the reference voltage Vref 130, the comparator output 212 is driven to a logical "true" voltage, which is the positive power supply Vcc voltage in the preferred embodiment. Conversely, when the voltage at the input 202 is greater than the reference voltage Vref 130, the comparator output 212 is driven to a logical "false" voltage, which is the negative power supply earth ground in the preferred embodiment.

There is no requirement that the monitored node ESD protection failure indicator 209 within each resistance comparison circuit be implemented as an LED. For example, each resistance comparison circuit can alternatively have a buzzer of a distinctive pitch as its monitored node ESD protection failure indicator 209. Moreover, there is no requirement that each resistance comparison circuit 200 include a monitored node ESD protection failure indicator 209 at all. Because the ESD protection continuous monitoring device 100 includes an ESD protection failure indicator (127 & 128, FIG. 1) which activates when any one of the resistance comparison circuits detects a failure, the specific information as to which monitored node caused the failure is an optional feature. When the ESD protection failure indicator 127 & 128 activates, a human operator of the semiconductor handler 205 is signaled to take the handler 205 off-line for preventative measures. If each resistance comparison circuit 109–116 (FIG. 1) includes its indicator 209, then the human operator knows specifically which monitored node or nodes have violated the ESD protection specification.

Moreover, the resistance comparison circuits 200 can be implemented so as to produce opposite polarity outputs. By reversing the connectivity of the plus and minus inputs of the comparator 201, the logical polarity of the outputs is inverted. In this case, the failure indicator LED 210 is coupled to ground on its cathode through a current limiting resistor 211 and to the comparator output 212 on its anode.

Figure 3C:
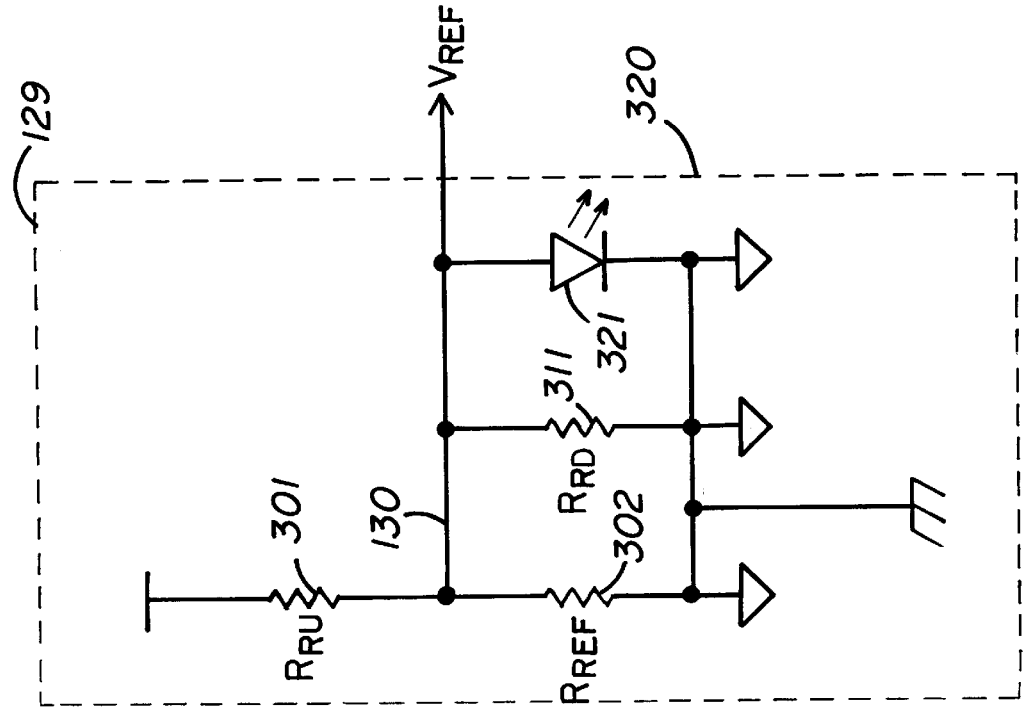
FIG. 3C illustrates yet another embodiment of a reference voltage generator suitable for use in an ESD continuous monitoring device according to the present invention.
Figure 3B:
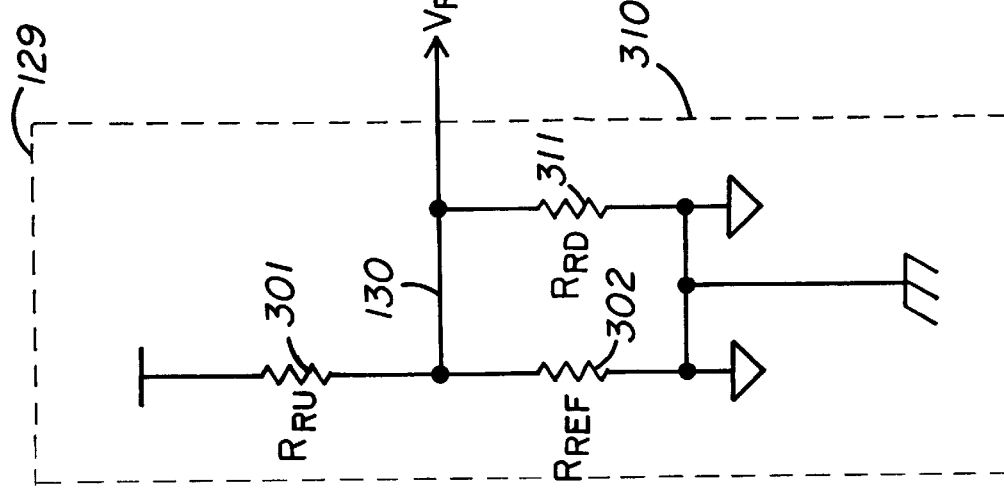
FIG. 3B illustrates another embodiment of a reference voltage generator suitable for use in an ESD continuous monitoring device according to the present invention.
Figure 3A:
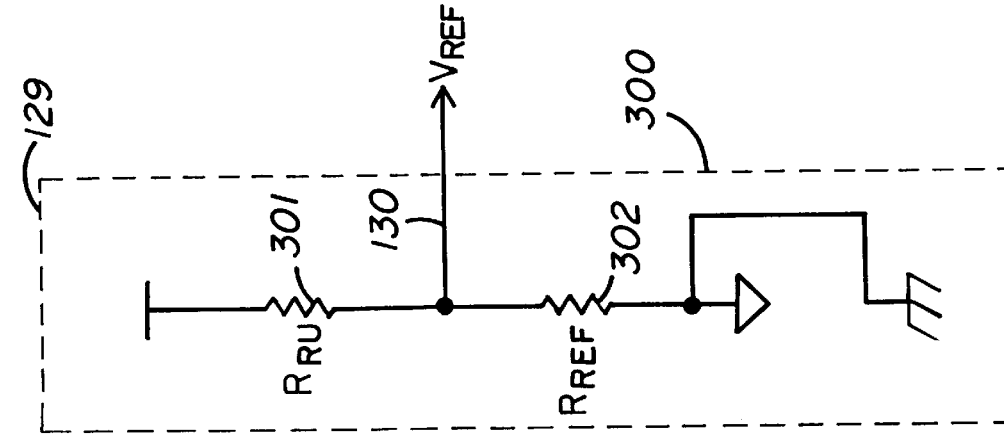
FIG. 3A illustrates one embodiment of a reference voltage generator suitable for use in an ESD continuous monitoring device according to the present invention.

FIGS. 3A–3C illustrate three alternative embodiments of a reference voltage generator 129 (FIG. 1) suitable for use in an ESD continuous monitoring device 100 according to the present invention. One embodiment 300 includes an upper reference voltage generator resistor 301 $R_{RU}$ and a reference resistor 302 $R_{REF}$. In this embodiment the reference voltage Vref 130 is $Vcc*R_{REF}/(R_{RU+RREF})$.

In an alternative embodiment 310 of the reference voltage generator 129 illustrated in FIG. 3B, a pulldown resistor $R_{RD}$, 311 (lower reference voltage generator resistor) is included. In this embodiment, the reference voltage $V_{REF}$ 130 is $Vcc*R_{REF}R_{RD}/(R_{RU}R_{RD}+R_{RU}R_{REF}+R_{RD})$ In the presently preferred embodiment 320 of the reference voltage generator 129 illustrated in FIG. 3C, a light emitting diode 321 (reference resistance failure light emitting diode) is included which illuminates when the reference resistor $R_{REF}$ 302 has burned out or otherwise offers an unacceptably high resistance. In all of the above embodiments, so long as $R_{REF}<<R_{RU}$ and $R_{REF}<<R_{RD}$, the reference voltage $V_{REF}$ 130 is approximately $Vcc*R_{REF}/R_{RU}$. In the embodiment 320 illustrated in FIG. 3C, the light emitting diode 321 remains off so long as the reference voltage $V_{REF}$ 130 is less than the turn-on voltage of the light emitting diode 321, which is typically around 0.6V to 0.8V.

The standard supply voltage is around 5V. Because the presently preferred values for resistors $R_{RU}$ and $R_{RD}$, are 1000 ohms while the reference resistor $R_{REF}$ is 8.2 ohms, the reference voltage is normally about 0.04 Volts. If the reference resistor burns out, then the reference voltage $V_{REF}$ 130 increases to 5V in the circuit of FIG. 3A, to around 2.5 Volts in the circuit of FIG. 3B, and to around 0.7 Volts in the circuit of FIG. 3C as the LED 321 is illuminated.

In the presently preferred embodiment, there is no requirement that the pulldown resistor $R_{RD}$ 311 be implemented; however, in order to facilitate an accurate reference voltage 130 for the resistance comparison circuits 109–116, it is included. In the resistance comparison circuits 200, the pullup resistor 203 and pulldown resistor 208 are each 1000 ohms. By using the same 1000 ohm resistances in the reference pullup 301 and the reference pulldown 311, the reference resistance 302 is exactly analogous to the equivalent grounding resistance $R_G$ 206 through the semiconductor handler 205. In other words, if $R_G$ is greater than $R_{REF}$, the resistance comparison circuit detects an ESD protection failure.

If the pulldown resistor 208 is omitted from the resistance comparison circuit, then the reference voltage generator 300 illustrated in FIG. 3A is appropriate for the ESD protection continuous monitoring device 100, so that an ESD protection failure will be detected when $R_{REF}$ is less than $R_G$.

Although the operational amplifier 201 typically has a very high input resistance into the plus and minus inputs, the reference voltage generator 129 must supply all the current into the plus inputs of all of the comparators. Therefore, the reference resistor 302 as well as the pullup reference resistor 301 and the pulldown reference resistor 311 are implemented with higher power capacities than the pullup resistors 203 and the pulldown resistors 208 within the resistance comparison circuits 109–116.

Figure 4:
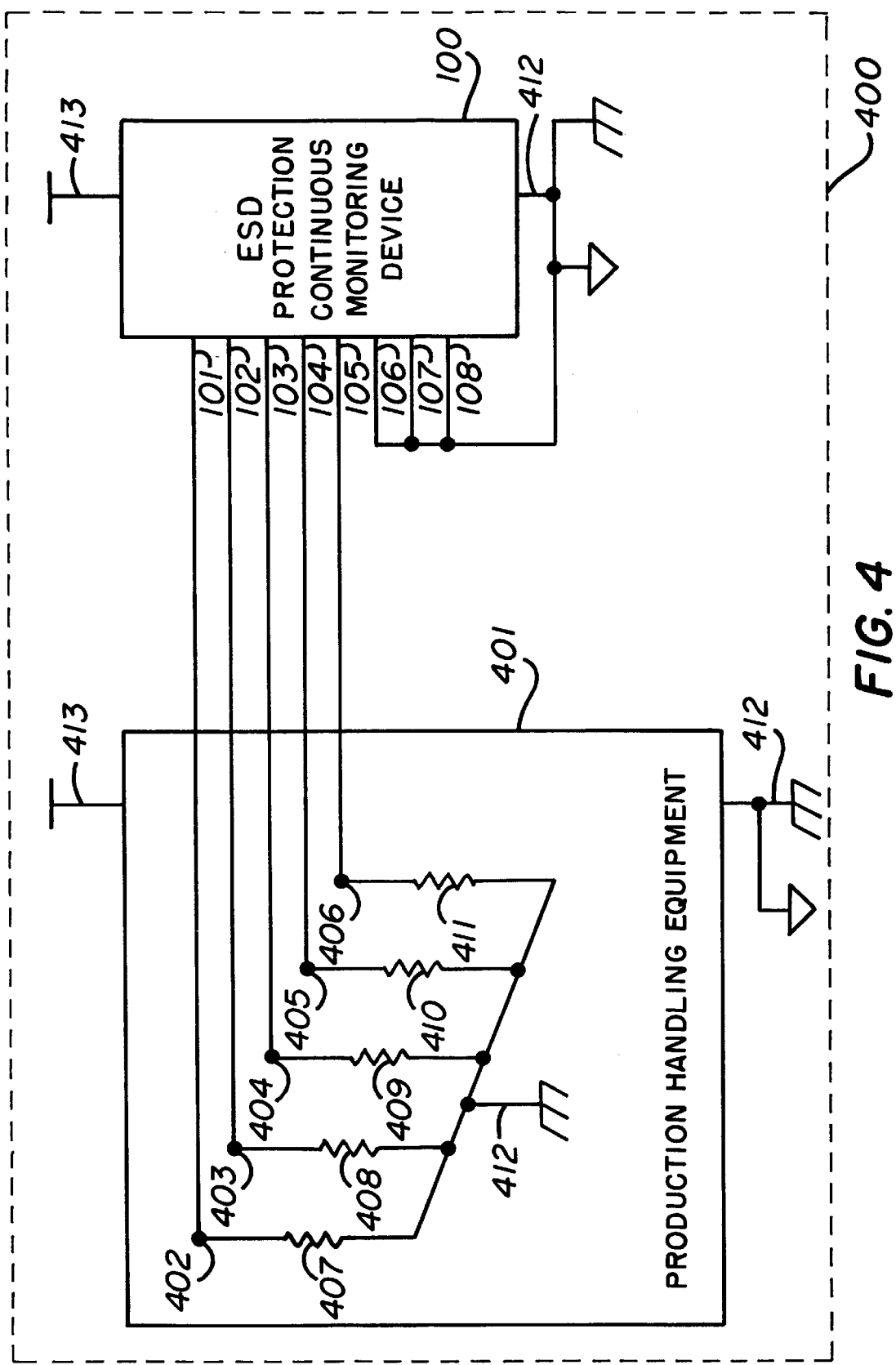
FIG. 4 illustrates a semiconductor handling system according to-the present invention.

FIG. 4 illustrates one way that the ESD protection continuous monitoring device 100 illustrated in FIG. 1 can be configured into a semiconductor handling system 400 so as to monitor five electrical nodes 402–406 of a production handler 401. The production handling equipment 401 illustrated in FIG. 4 is shown in the abstract. In practice, the production handling equipment 401 is typically a complex electromechanical machine or series of machines performing a variety of mechanical and electrical operations on the semiconductor wafers, dies, or packages as they are processed after wafer fabrication through to fully packed products ready for shipment. The monitored nodes 402–406 are typically the moving parts, critical nodes, and nodes which make direct contact with the devices being processed. The positive power supplies 413 and earth ground power supplies 412 of the semiconductor handler 401 and ESD protection continuous monitoring device 100 are the same.

Each resistance comparison circuit within the ESD protection continuous monitoring device 100 measures a resistance seen from the corresponding input through the production handler 401 to the earth ground potential. For example, in FIG. 4, the first input 101 of the ESD protection continuous monitoring device 100 is coupled to an electrical node 402 within the production handling equipment 401. An electrical resistance 407 exists between the electrical node 402 and the earth ground potential 412. The resistances 407–411 do not symbolize physical resistors, but rather the individual resistances equivalent to the total resistance through the various parts of the production handler 401 from the corresponding electrical node to the earth ground potential 412. For example, node 402 might be on an pivoting arm which physically moves the semiconductor packages. Because the pivoting arm directly contacts the products, it is important that the arm be properly protected from static charge build-up which could lead to an ESD event which damages the product. If the electrical resistance 407 through the production handler 401 from the electrical node 402 to the earth ground potential 412 is less than the maximum acceptable grounding resistance, then the arm is properly protected from static charge build-up, because any currents induced by movement or the arm or any accumulated charges on the arm will discharge through the production handler 401 having equivalent resistance 407 into the earth. This discharge through the production handler's equivalent resistance 407 prevents undesirable electrostatic discharge through the product (not shown).

In FIG. 4, because only five electrical nodes 402–406 are being monitored, the remaining three unused inputs 106–108 are connected to the earth ground potential, so that the ESD protection continuous monitoring device will see a zero equivalent resistance to earth ground through the unused inputs 106–108. Because a zero resistance is always less than any maximum acceptable grounding resistance, the grounded unused inputs 106–108 will not cause the ESD protection continuous monitoring device 100 to detect an ESD protection failure.

The present invention has been described above with respect to its preferred embodiments. Those embodiments are offered by way of example, not by way of limitation. Accordingly, those skilled in the art of the present invention will be enabled by this disclosure to make various modifications to the embodiments described herein without departing from the spirit and scope of the present invention. Those modifications are deemed to lie within the spirit and scope of the present invention as set forth in the appended claims.

What is claimed is:

1. An ESD protection continuous monitoring device comprising:

a plurality of resistance comparison circuits, wherein each resistance comparison circuit is operable to compare a grounding resistance to a maximum acceptable ESD protection resistance;

a logic circuit coupled to the plurality of resistance comparison circuits; and an ESD protection failure indicator coupled to the logic circuit.

2. An ESD protection continuous monitoring device as in claim 1, wherein the ESD protection failure indicator comprises:

a buzzer.

3. An ESD protection continuous monitoring device as in claim 1, wherein the ESD protection failure indicator comprises:

a lamp.

4. An ESD protection continuous monitoring device comprising:

a plurality of resistance comparison circuits;

a logic circuit coupled to the plurality of resistance comparison circuits; and an ESD protection failure indicator coupled to the logic circuit;

wherein each resistance comparison circuit of the plurality of resistance comparison circuits comprises:

a comparator having a positive comparator input coupled to a reference node, having a negative comparator input coupled to a monitor node, and having a comparator output; and an upper voltage divider resistor having a positive upper voltage divider resistor terminal coupled to a positive power supply, and having a negative upper voltage divider resistor terminal coupled to the negative comparator input.

5. An ESD protection continuous monitoring device as in claim 4, wherein each resistance comparison circuit of the plurality of resistance comparison circuits further comprises:

a lower voltage divider resistor having an positive lower voltage divider resistor terminal coupled to the negative comparator input, and having a negative lower voltage divider resistor terminal coupled to a ground power supply.

6. An ESD protection continuous monitoring device as in claim 5, further comprising:

a reference voltage generator for maintaining a predetermined reference voltage at the reference node.

7. An ESD protection continuous monitoring device as in claim 6, wherein the reference voltage generator comprises:

an upper reference voltage generator resistor having a positive upper reference voltage generator resistor terminal and a negative upper reference voltage generator resistor terminal; and a reference resistor having a positive reference resistor terminal coupled to the reference node and a negative reference resistor terminal coupled to the ground power supply;

a lower reference voltage generator resistor having a positive lower reference voltage generator resistor terminal and a negative lower reference voltage generator resistor terminal;

wherein the negative upper reference voltage generator resistor terminal is coupled to the reference node; and wherein the positive upper reference voltage generator resistor terminal is coupled to the positive power supply.

8. An ESD protection continuous monitoring device as in claim 7, wherein the reference voltage generator further comprises:

a lower reference voltage generator resistor having a positive lower reference voltage generator resistor terminal coupled to the reference node and having a negative lower reference voltage generator resistor terminal coupled to the ground power supply.

9. An ESD protection continuous monitoring device as in claim 7, wherein the reference voltage generator further comprises:

a reference resistor failure indicator coupled to the reference node which activates when the reference resistor's resistance is higher than a predetermined ESD protection maximum grounding resistance.

10. An ESD protection continuous monitoring device as in claim 8, wherein the reference resistance failure indicator comprises:

a reference resistance failure light emitting diode having a cathode coupled to the reference node and an anode coupled to the ground power supply.

11. An ESD protection continuous monitoring device as in claim 5, wherein each resistance comparison circuit of the plurality of resistance comparison circuits further comprises:

a monitored node ESD protection failure indicator that activates when the comparator detects that the monitor input is higher in voltage than the reference node.

12. An ESD protection continuous monitoring device as in claim 11, wherein the monitored node ESD protection failure indicator within each resistance comparison circuit comprises:

a monitored node ESD protection failure light emitting diode having a cathode and an anode, wherein the anode is coupled to the comparator output.

13. An ESD protection continuous monitoring device as in claim 12, wherein the monitored node ESD protection failure indicator within each resistance comparison circuit further comprises:

a current limiting resistor having a positive current limiting terminal coupled to the positive power supply and having a negative current limiting terminal coupled to the cathode of the ESD protection failure light emitting diode.

14. An ESD protection continuous monitoring device as in claim 13, wherein the logic circuit coupled to the plurality of resistance comparison circuits comprises:

a NAND circuit having a plurality of NAND inputs and a NAND output, wherein each comparator output from the plurality of resistance comparison circuits is coupled to a corresponding NAND input.

15. An ESD protection continuous monitoring device as in claim 14, wherein the ESD protection failure indicator comprises:

a buzzer having a positive terminal coupled to the NAND output and having a negative terminal coupled to the ground power supply.

16. An ESD protection continuous monitoring device as in claim 14, wherein the ESD protection failure indicator comprises:

a light-emitting diode having a cathode coupled to the NAND output and having an anode coupled to the ground power supply.

17. An ESD protection continuous monitoring device comprising:

a plurality of resistance comparison circuits each having a monitor input, a reference input, and a comparator output;

a logic circuit coupled to the plurality of comparator outputs having a logic circuit output;

a reference resistor coupled to the plurality of reference inputs; and an ESD protection failure indicator coupled to the logic circuit which activates when any one of the plurality of comparator outputs is asserted.

18. An ESD protection continuous monitoring device as in claim 17, wherein the reference resistor is less than 10 ohms.

19. An ESD protection continuous monitoring device as in claim 18, wherein the plurality of resistance comparison circuits comprises:

sixteen resistance comparison circuits.

20. A semiconductor handling system comprising:

a production handling machine having a plurality of electrical nodes and being coupled to a positive power supply and an earth ground power supply, wherein the production handler physically interfaces with a semiconductor product; and a continuous ESD protection monitoring device coupled to the production handler, the continuous ESD protection monitoring device being coupled to the positive power supply and the earth ground supply and having a plurality of monitor inputs and an ESD protection failure indicator;

wherein each electrical node in the plurality of electrical nodes is coupled to a corresponding monitor input from among the plurality of monitor inputs;

such that the ESD protection failure indicator is activated during operation of the production handler when the continuous ESD protection monitoring device detects that at least one electrical node in the plurality of electrical nodes has a resistance to the ground power supply greater than a predetermined ESD protection maximum grounding resistance.

21. A semiconductor production handling system as in claim 20, wherein monitor inputs not coupled to an electrical node are coupled to the earth ground power supply.

22. A semiconductor production handling system as in claim 21, further comprising:

a plurality of electrical cables, wherein each electrical cable connects an electrical node to a corresponding monitor input.

23. A semiconductor production handling system as in claim 22, wherein the plurality of electrical cables comprise low-resistance, high-temperature cables.

* * * * *